(12) United States Patent
Mochizuki et al.

(10) Patent No.: US 10,748,779 B2
(45) Date of Patent: Aug. 18, 2020

(54) SUBSTRATE PROCESSING METHOD

(71) Applicant: Tokyo Electron Limited, Tokyo (JP)

(72) Inventors: Hiroaki Mochizuki, Miyagi (JP); Shinobu Kinoshita, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 16/229,143

(22) Filed: Dec. 21, 2018

(65) Prior Publication Data
US 2019/0198335 A1  Jun. 27, 2019

(30) Foreign Application Priority Data

Dec. 25, 2017  (JP) ................... 2017-247972

(51) Int. Cl.
*H01L 21/306* (2006.01)
*H01L 21/3065* (2006.01)
*H01J 37/32* (2006.01)

(52) U.S. Cl.
CPC .... *H01L 21/3065* (2013.01); *H01J 37/32091* (2013.01); *H01J 37/32174* (2013.01); *H01J 37/32532* (2013.01)

(58) Field of Classification Search
CPC ........... H01L 21/3065; H01L 21/67276; H01L 21/67253; H01L 21/67248; H01L 21/6831; H01J 37/32174; H01J 37/32091; H01J 37/32532
See application file for complete search history.

(56) References Cited

U.S. PATENT DOCUMENTS

| | | | | |
|---|---|---|---|---|
| 2009/0242543 A1* | 10/2009 | Nenyei | .................. | G05D 23/27 219/412 |
| 2015/0105895 A1* | 4/2015 | Moyne | .................. | G05B 13/04 700/121 |
| 2016/0104606 A1* | 4/2016 | Park | .................. | H01J 37/32082 156/345.38 |

FOREIGN PATENT DOCUMENTS

| JP | 2005-333075 | 12/2005 |
|---|---|---|
| JP | 2011-003712 | 1/2011 |

* cited by examiner

*Primary Examiner* — Duy Vu N Deo
(74) *Attorney, Agent, or Firm* — IPUSA, PLLC

(57) ABSTRACT

Provided is a substrate processing method including: referring to a memory unit in which an estimated model of sensor data generated from sensor data input to or output from each of the processing chamber when processing first test substrates are processed in the processing chambers under a same processing condition; adjusting an apparatus parameter of each of the processing chambers such that a deviation of the sensor data from an ideal sensor value is within an allowable range; loading product substrates continuously into the processing chambers without specifying a loading destination processing chamber; and, when the product substrate is loaded into a processing chamber of the processing chambers, adjusting the sensor data input to or output from the processing chamber into which the product substrate has been loaded based on the apparatus parameter of the processing chamber that has been adjusted in the adjusting; and processing the product substrate.

6 Claims, 9 Drawing Sheets

| MEASUREMENT TIME | SENSOR DATA | SENSOR TYPE | PROCESSING UNIT NAME |
|---|---|---|---|
| t1 | A1 | A | CA |
| t2 | B1 | B | CB |
| t3 | A2 | A | CA |
| t4 | B2 | B | CB |
| t5 | A3 | A | CA |
| t6 | B3 | B | CB |
| t7 | A4 | A | CA |
| t8 | B4 | B | CB |
| ⋮ | ⋮ | ⋮ | ⋮ |

FIG.4

| MEASUREMENT TIME | SENSOR DATA | SENSOR TYPE | PROCESSING UNIT NAME |
|---|---|---|---|
| t1 | A1 | A | CA |
| t2 | B1 | B | CB |
| t3 | A2 | A | CA |
| t4 | B2 | B | CB |
| t5 | A3 | A | CA |
| t6 | B3 | B | CB |
| t7 | A4 | A | CA |
| t8 | B4 | B | CB |
| ⋮ | ⋮ | ⋮ | ⋮ |

SUBSTRATE PROCESSING METHOD

BACKGROUND OF THE INVENTION

1. Field of the Invention

The present invention relates to a substrate processing method.

2. Description of the Related Art

Feed-forward control and feedback control have been performed in which wafer processing is performed based on a recipe, and deviation from an expected value of the result of wafer processing (e.g., CD value, or the like) is fed back to processing of the next wafer or the next lot. For example, in a substrate processing system including a plurality of processing chambers, each of the processing chambers has a different internal condition. Therefore, Patent Document 1 discloses a technique in which the feed-forward control and the feedback control are performed by: measuring characteristics of product wafers using a measurement instrument before and after processing the product wafer; and causing a difference between a measurement value and a target value to be reflected to a setting value of the processing recipe in order to adjust the difference between the measurement value and the target value.

Further, Patent Document 2 discloses that adjustment parameters are stored in the case where the same processing recipe is used for the processing using a different processing chamber. Patent Document 2 discloses that each step of predetermined processing is preprogrammed and a product processing recipe is provided which includes parameters corresponding to processing conditions, and that the parameters for each processing chamber is adjusted based on a result of adjustment processing in which the predetermined processing is performed for a product substrate for adjustment based on an adjustment processing recipe.

CITATION LIST

Patent Document

[Patent Document 1] Japanese Unexamined Patent Application Publication No. 2011-3712
[Patent Document 2] Japanese Unexamined Patent Application Publication No. 2005-333075

SUMMARY OF THE INVENTION

Technical Problem

However, when the wafer processing is performed based on the processing recipe, there tends to be performance differences between the processing chambers with respect to the internal conditions due to the change overtime of the processing chambers. Under such circumstances, results of the wafer processing may not be as expected just by the adjustment of the recipe parameters or the adjustment parameters according to the individual difference of the processed wafer, due to the performance differences between the processing chambers.

For example, although it is desired that a uniform processing result per lot should be obtained for a plurality of wafers included in the same lot, it is not allowed to specify which processing chamber is used for the plurality of wafers in the lot in a cluster-type substrate processing system. Therefore, when the same wafer processing is applied to a plurality of wafers in the same lot using different processing chambers based on the recipe, the result of the wafer processing tends to vary according to the processing chambers on which the wafers are loaded due to the individual difference of the processing chambers and the difference in degree of aged deterioration, and thus, there may be a case in which the result of the wafer processing is not as expected.

In view of the above problem, an object of an aspect of the present invention is to provide uniformity in the processing of product substrates with a plurality of processing chambers by allowing a range of difference between the conditions of the processing chambers.

Solution to Problem

In order to solve the above-described problem, according to an aspect of the present invention, a substrate processing method using a substrate processing apparatus including a plurality of processing chambers for processing a substrate is provided. The substrate processing method includes: adjusting an apparatus parameter of each of the processing chambers such that a deviation from an ideal sensor value of the output or input sensor data is within an allowable range by referring to a memory (storage) unit that stores an estimated model of sensor data generated from sensor data input to or output from each of the processing chambers when processing first test substrates in the plurality of processing chambers under a same processing condition; continuously loading the plurality of the processing chambers with a product substrate without specifying the processing chamber to be loaded with the product substrate in advance; and processing the product substrate by adjusting sensor data to be input to or output from the processing chamber which is loaded with the product substrate, based on apparatus parameters, which have been adjusted in the adjusting, of a processing chamber when the processing chamber is loaded with the product substrate in the loading.

Advantageous Effects of Invention

According to an aspect of the present invention, it is possible to provide uniformity in the processing of product substrates with a plurality of processing chambers by causing differences between the conditions of the processing chambers to be within an allowable range.

BRIEF DESCRIPTION OF THE DRAWINGS

FIG. 4 is a drawing illustrating an example of a table of an estimated model of sensor data according to an embodiment of the present invention.

DETAILED DESCRIPTION OF THE PREFERRED EMBODIMENTS

Figure 1:
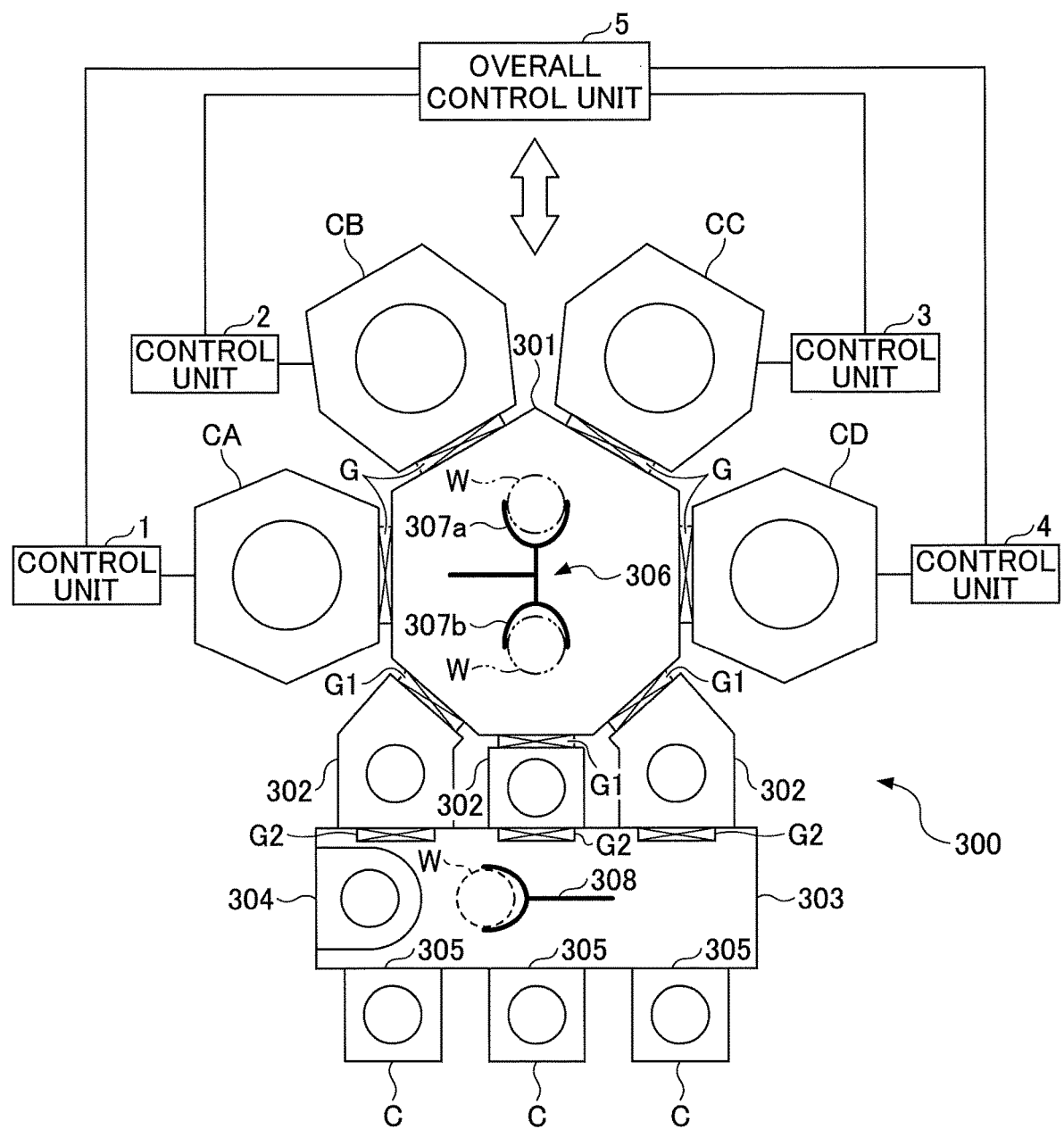
FIG. 1 is a drawing illustrating an example of a substrate processing apparatus according to an embodiment of the present invention.

In the following, an embodiment of the present invention will be described while making reference to the drawings. It should be noted that, in the present specification and the drawings, a same reference numeral is given to substantially a same structure, and duplicated descriptions will be omitted.

[Substrate Processing Apparatus]

First, referring to FIG. 1, a substrate processing apparatus 300 according to an embodiment of the present invention will be described. FIG. 1 is a horizontal sectional view illustrating an example of the substrate processing apparatus 300. The substrate processing apparatus 300 is a multiple-chamber type vacuum processing system including four processing units CA, CB, CC, and CD. The processing units CA, CB, CC, and CD are connected to corresponding walls of a vacuum loading room 301 having a heptagon shape in a plan view via corresponding gate valves G. The inside of the vacuum loading room 301 is exhausted by a vacuum pump and maintained in a predetermined degree of vacuum.

In an embodiment of the present invention, the substrate processing apparatus 300 performs "OR loading" in which the processing units are continuously loaded with a plurality of product wafers W as examples of product substrates without specifying the processing unit to be loaded with the product wafer W by using the processing units CA, CB, CD, and CD in parallel. Further, in each of the plurality of the processing units which are loaded with the product wafers W, predetermined processing such as etching, deposition (film formation), ashing, or the like is performed under the same processing condition.

Three load lock rooms 302 are connected to the other three walls of the vacuum loading room 301 via gate valves G1. An atmosphere loading room 303 is provided on a side, of the load lock rooms 302, opposite to the vacuum loading room 301, the load lock room 302 being sandwiched by the atmosphere loading room 303 and the vacuum loading room 301. Three load lock rooms 302 are connected to the atmosphere loading room 303 via gate valves G2. The load lock rooms 302 are used for controlling pressure between the atmosphere and the vacuum when conveying wafers between the atmosphere loading room 303 and the vacuum loading room 301.

Three carrier attachment ports 305, which are used for attaching carriers (FOUP, or the like) C for accommodating a wafer, are provided on walls on a side, of the atmosphere loading room 303, opposite to the wall to which the load lock rooms 302 are attached Further, an alignment chamber 304 used for wafer alignment is provided on a side wall of the atmosphere loading room 303. A down flow of clean air is formed inside the atmosphere loading room 303. A loading mechanism 306 is provided in the vacuum loading room 301. The loading mechanism 306 is used for loading the processing units CA, CB, CC, and CD, and the load lock rooms 302 with wafers. The loading mechanism 306 includes two loading arms 307a and 307b that are independently capable of moving.

A loading mechanism 308 is provided in the atmosphere loading room 303. The loading mechanism 308 is used for loading the carriers C, the load lock rooms 302, and the alignment chamber 304 with wafers.

The substrate processing apparatus 300 includes an overall control unit 5. The overall control unit 5 is connected to control units 1 to 4, and controls each part of the substrate processing apparatus 300 in cooperation with the control units 1 to 4. As the parts of the substrate processing apparatus 300, an exhaust mechanism, a gas supplying mechanism, and the loading mechanism 306 for the vacuum loading room 301, an exhaust mechanism and a gas supplying mechanism for the load lock rooms 302, the loading mechanism 308 for the atmosphere loading room 303, a driving system for the gate valves G, G1, and G2, etc., can be listed.

The control unit 1 is connected to the processing unit CA, and controls each part of the processing unit CA. The control unit 2 is connected to the processing unit CB, and controls each part of the processing unit CB. The control unit 3 is connected to the processing unit CC, and controls each part of the processing unit CC. The control unit 4 is connected to the processing unit CD, and controls each part of the processing unit CD.

The overall control unit 5 includes a CPU (computer), an input device (keyboard, mouse, or the like), an output device (printer, or the like), a display device (display, or the like), a memory (storage) device (memory (storage) medium). The overall control unit 5 causes the substrate processing apparatus 300 to perform predetermined operations based on processing recipes stored, for example, in the built-in memory medium in the memory device, or in the memory medium set in the memory device. It should be noted that the overall control unit 5 may be a higher rank control unit of the control units 1 to 4 for the processing units.

Next, operations of the substrate processing apparatus 300, whose structure is as described above, will be described. The following process operations are performed by the CPU of the overall control unit 5 based on the procedure set in the processing recipes. First, a wafer is taken out, by the loading mechanism 308, from a carrier C that is connected to the atmosphere loading room 303. A gate valve G2 of one of the load lock rooms 302 is opened and the wafer is loaded into the one of the load lock rooms 302 via the alignment chamber 304. After the gate valve G2 is closed, the air is exhausted from the load lock room 302 to create a perfect vacuum.

When a predetermined degree of vacuum is achieved in the load lock room 302, the gate valve G1 is opened and the wafer is taken out from the load lock room 302 by one of the loading arms 307a and 307b of the loading mechanism 306.

Further, the overall control unit 5 performs the "OR loading" by continuously loading a plurality of taken-out wafers into available (vacant) ones of the processing units CA, CB, CC, and CD without specifying the processing unit to be loaded in advance. According to the above, the substrate processing apparatus 300 loads a plurality of wafers into a plurality of processing units, and performs the same processing under the same condition at the same time in parallel.

When one of the processing units CA, CB, CC, and CD to be loaded is determined in the "OR loading", the gate valve G of the determined processing unit is opened, a wafer held by one of the loading arms of the loading mechanism 306 is loaded into the processing unit, and the loading arm, from which the wafer is unloaded, is returned to the vacuum loading room 301. When the loading arm is returned to the vacuum loading room 301, the gate valve G is closed and predetermined processing is performed in the processing unit.

After the predetermined processing for the wafer is finished, the gate valve G of the processing unit is opened, and the wafer in the processing unit is unloaded by one of the loading arms 307a and 307b of the loading mechanism 306. Further, one of the gate valves G1 of the load lock room 302 is opened, and the wafer on the loading arm is loaded into the one of the load lock rooms 302. Further, the vacuum of the one of the load lock rooms 302 is returned to a normal atmosphere, the gate valve G2 is opened, and the wafer is returned to one of the carriers C by the loading mechanism 308. The processing for a predetermined number of wafers is completed by performing the above-described processing for a plurality of wafers in parallel at the same time.

[Processing Unit]

Figure 2:
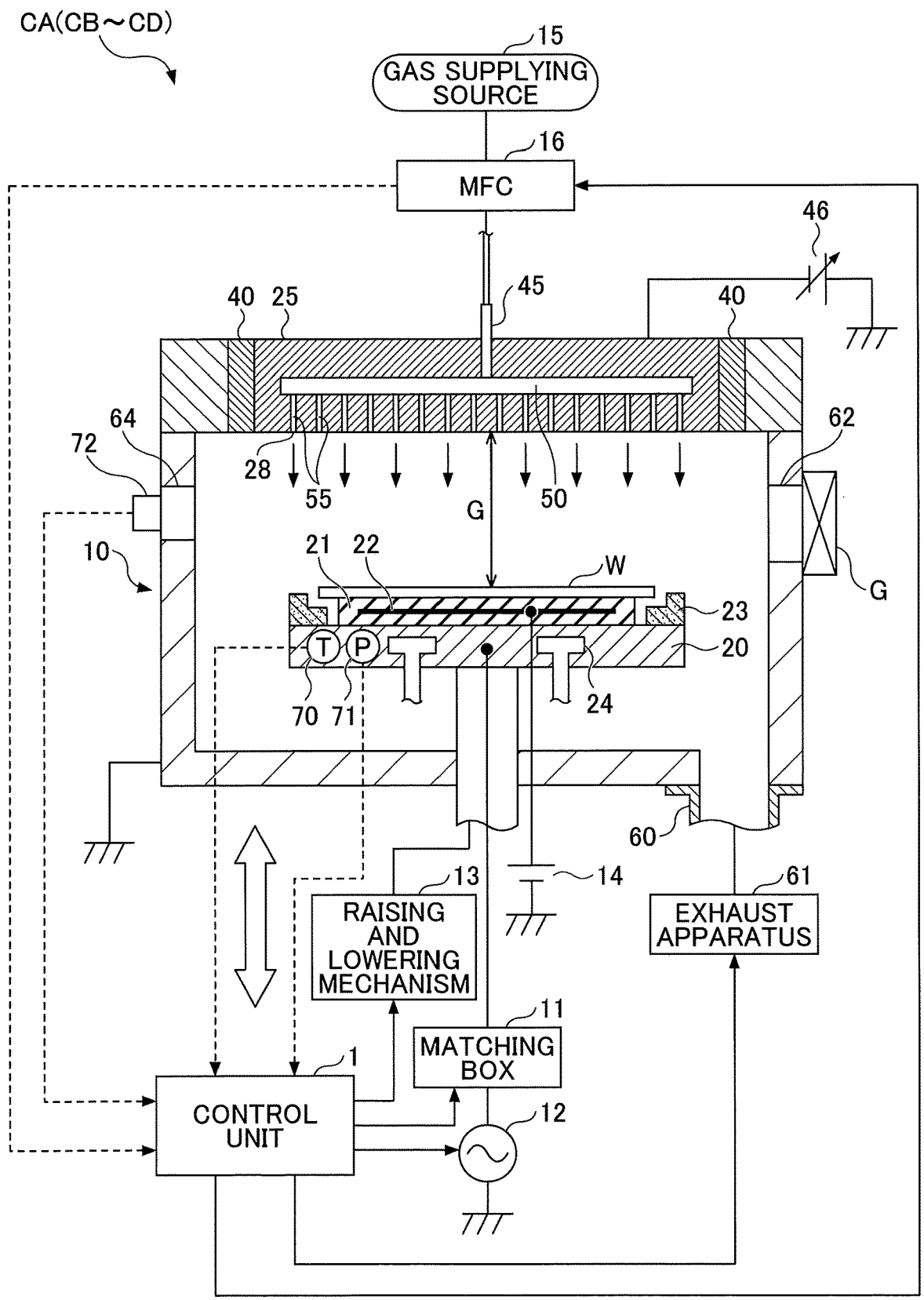
FIG. 2 is a drawing illustrating an example of a processing unit according to an embodiment of the present invention.

Next, referring to FIG. 2, structures of the processing units CA, CB, CC, and CD will be described. FIG. 2 is a drawing illustrating an example of a processing unit according to an embodiment of the present invention. In an embodiment of the present invention, structures of the processing units CA, CB, CC, and CD are the same, and structures of the control units 1 to 4 are the same. Therefore, the structure and operations of the processing unit CA and the structure and operations of the control unit 1 will be described, and the structures and the operations of the remaining processing units CB, CC, and CD, and the structures and the operations of the remaining control units 2 to 4 will be omitted from the description. Further, as an example of the processing unit, a capacitively coupled plasma etching apparatus will be described.

The plasma etching apparatus as an example of the processing unit CA includes, for example, a cylindrical processing chamber 10 made of aluminum. Alumite treatment (anodizing treatment) is applied to the surface of the processing chamber 10. The processing chamber 10 is grounded.

A stage 20 is provided in the processing chamber 10. The stage 20 includes a base made of aluminum or titanium, for example. Electro-static chuck 21 is provided on the base of the stage 20. The electro-static chuck 21 includes an attracting electrode 22 made from a conductive film and insulating sheets, the attracting electrode 22 being sandwiched by the insulating sheets. A direct current (DC) voltage is applied to the attracting electrode 22 from a DC power supply 14 to create a Coulomb force, and a wafer W is attracted to and held on the electro-static chuck 21 according to the created Coulomb force. In order to increase in-plane etching uniformity, a focus ring 23 made of silicon, for example, is provided on the circumference portion of the electro-static chuck 21, the circumference portion of the wafer W being surrounded by the focus ring 23.

A high-frequency power supply 12 for exciting plasma is connected to the stage 20 via a matching box 11. A second high-frequency power supply for drawing an ion in the plasma into the wafer may be connected to the stage 20 via the matching box. For example, the high-frequency power supply 12 applies to the stage 20 high-frequency power with a frequency (e.g., 60 MHz) that is appropriate for generating plasma in the processing chamber 10. It should be noted that the second high-frequency power supply may apply to the stage 20 high-frequency power with a frequency (e.g., 13.56 MHz) that is appropriate for drawing an ion in the plasma into the wafer. In this way, the stage 20 is not only used for placing a wafer thereon, but also used for functioning as a lower electrode.

On the ceiling of the processing chamber 10, a gas shower head 25 is provided as an upper electrode with a ground potential, the gas shower head 25 being provided on the inner circumference side of a ring-shaped insulating member 40 so as to close the ceiling. According to the above arrangement, the high-frequency power from the high-frequency power supply 12 is capacitively applied to between the stage 20 and the gas shower head 25.

In the gas shower head 25, a gas diffusion room 50, gas supplying pipes 28, and a plurality of gas ventilation holes 55 are formed, the gas ventilation holes 55 being provided at the ends of the gas supplying pipes 28. A gas supplying source 15 supplies a processing gas to the inside of the gas shower head 25 via a gas supplying pipe 45 at a constant flow rate according to a MFC (mass flow controller) 16. The gas is diffused in the gas diffusion room 50, and introduced into the processing chamber 10 through the gas supplying pipes 28 and the gas ventilation holes 55.

An exhaust pipe 60, which forms an exhaust port, is provided in the bottom of the processing chamber 10, and the exhaust pipe 60 is connected to an exhaust apparatus 61. The exhaust apparatus 61 includes a vacuum pump such as a turbo-molecular pump, a dry pump, or the like. The exhaust apparatus 61 reduces pressure of the processing space in the processing chamber 10 to a predetermined degree of vacuum and exhausts the gas in the processing chamber 10 by leading the gas to the exhaust port. An adaptive pressure control (APC) valve is provided on the upstream side of the vacuum pump in the exhaust direction, and the pressure in the processing chamber 10 is adjusted by automatically adjusting conductance of the exhaust path. For example, in a plasma etching apparatus, during the processing, the processing pressure is controlled as desired by supplying a processing gas to the inside of the processing chamber 10 at a constant flow rate according to the MFC 16 while adjusting the conductance of the exhaust path according to the APC valve.

A coolant flow path 24 is formed in the base of the electro-static chuck 21. It is possible to control the temperature of a wafer W to be a predetermined temperature by circulating a coolant with the predetermined temperature output from a chiller unit in the coolant flow path 24 formed in the base. It should be noted that a heater may be embedded in the electro-static chuck 21, and that the temperature of the wafer W may be adjusted to be a predetermined temperature by applying an AC (alternative current) voltage from an AC power supply to the heater. Further, the temperature of the wafer W may be adjusted to be a predetermined temperature by supplying a heat transfer gas to between an upper surface of the electro-static chuck 21 and a rear surface of the wafer W.

The stage 20 is raised and lowered by a raising-and-lowering (elevator) mechanism 13. According to the above arrangement, it is possible to adjust a gap G between the stage 20 and the gas shower head 25 based on the processes.

The control unit 1 includes a CPU, a ROM (Read Only Memory), and a RAM (Random Access Memory) (not shown), and controls etching processing for a wafer W according to the procedures set in the processing recipes stored in the RAM, etc. Further, the control unit 1 stores apparatus parameters for the processing unit CA, and controls input and output data (input and output signal) for each of the parts in the processing unit.

In the processing unit as described above, when performing a predetermined process such as etching, the gap G between the stage 20 and the gas shower head 25 is adjusted according to the process by raising and lowering the raising-and-lowering mechanism 13.

Next, the gate valve G of the processing unit is opened, one of the loading arms 307a and 307b of the loading mechanism 306 goes into the processing unit CA through an opening 62, and a wafer W is loaded into the processing unit.

The wafer W is held by pusher pins (not shown) above the electro-static chuck 21, and is placed on the electro-static chuck 21 by having the pusher pins lowered. The gate valve G is closed after the loading of the wafer W. The pressure of the processing chamber 10 is reduced to a set value by the exhaust apparatus 61. A gas is introduced into the processing chamber 10 in a form of a shower from the gas shower head 25. A predetermined high-frequency power is applied to the stage 20. Further, a DC (direct current) voltage is applied to the attracting electrode 22 of the electro-static chuck 21. According to the above arrangement, the wafer W is electro-statically attracted onto the electro-static chuck 21.

The introduced gas is plasmatized by the high-frequency power, and a predetermined process such as etching is performed for the wafer W by the plasmatized gas. After the completion of the plasma etching, the wafer W is held by one of the loading arms 307a and 307b, and is carried out of the processing chamber 10. The wafers W are processed continuously by having predetermined processes performed in parallel repeatedly in the processing units CA, CB, CC, and CD.

The control unit 1 controls the input and output data for the processing unit CA based on the setting of the apparatus parameters. The apparatus parameters include parameters for at least one of a high-frequency power control device, a pressure control device, a gas control device, a temperature control device, a DC voltage control device, and a position control device.

As examples of the high-frequency power control device, a high-frequency power supply 12 and a matching box 11 may be listed. As an example of the pressure control device, an exhaust apparatus 61 (e.g., APC) may be listed. As an example of the gas control device, a MFC 16 may be listed. As examples of the temperature control device, a chiller unit, a heater, and a heat transfer gas supplying mechanism may be listed.

As an example of the DC voltage control device, a DC power supply 46 may be listed. As an example of the position control device, a raising-and-lowering mechanism 13 may be listed. It should be noted that, in the case where a raising-and-lowering mechanism capable of raising and lowering the focus ring 23 is provided, the raising-and-lowering mechanism is an example of the position control device.

The apparatus parameters are parameters for the parts included in each of the processing units, and the control unit 1 adjusts the setting values of the apparatus parameters. With the above arrangement, it is possible to absorb performance difference between the processing units and aged deterioration by adjusting the apparatus parameters. According to the above arrangement, it becomes unnecessary for a user to change the settings of processing recipes and it is possible to reduce load of the user.

For example, the degrees of the aged deterioration in the processing units CA, CB, CC, and CD are different from each other because the processing periods and the input power amounts of the processing units CA, CB, CC, and CD are different from each other. Further, because there are individual differences among the processing units, inside conditions of the processing units CA, CB, CC, and CD are different from each other from the beginning.

With respect to the above, in the "OR loading", a plurality of the processing units are used in parallel, and it is important to cause results of the wafer processing performed under the same processing conditions in the loading destination processing units to have almost the same characteristics even though the inside conditions of the processing units are different from each other.

With respect to the above, in cooperation with the control units 1 to 4, the overall control unit 5 stores in a memory estimated models of sensor data set that are generated from sensor data sets input to and output from the processing units CA, CB, CC, and CD when first dummy wafers have been processed under the same processing conditions in the processing units CA, CB, CC, and CD. Further, by referring to the estimated models of sensor data set stored in the memory, the overall control unit 5 adjusts the apparatus parameters for each of the processing units so that deviations of the sensor data sets of the processing unit from ideal sensor values are within an allowable range. It should be noted that the estimated models of sensor data sets may be stored in a memory (memory unit) of the overall control unit 5, or may be stored in a memory device of a cloud computer that is connected to the overall control unit 5.

Further, the overall control unit 5 performs a predetermined process for a product wafer W according to the adjusted apparatus parameters and the processing recipes. In other words, the overall control unit 5 performs processing of the product wafer W in one of the processing units into which the product wafer W has been loaded according to the procedure of the processing recipes while adjusting the input/output sensor data sets based on the apparatus parameters for the one of the processing units. According to the above arrangement, it is still possible to adjust the input/output data sets according to the apparatus parameters for each processing unit even in the "OR loading" in which product wafers W are continuously loaded into the processing units without specifying the loading destination processing unit in advance. Therefore, even when the product wafer W is loaded into any one of the processing units, it is still possible to control predetermined processing for the product wafer W such that the processing result is within the allowable range in spite of the existence of performance differences among the processing units.

The sensor data sets include data sets that are detected by sensors included in the processing units and are input by the control units 1 to 4. Further, the sensor data sets include, as the data sets input to or output from the control units 1 to 4, optical data sets, electrical data sets, or physical data sets.

As an example of the optical data sets, a data set of the emission intensity may be listed. For example, a luminescence sensor 72 is attached to the processing chamber 10. The luminescence sensor 72 is capable of measuring the emission intensity of each frequency in the plasma in the processing chamber 10 through a quartz window 64 The data sets of the emission intensity of each frequency in the plasma detected by the luminescence sensor 72 are stored in a memory (memory unit) of control unit 1.

As examples of the electric data sets, control data for the high-frequency power, a Vpp voltage, a Vdc voltage output from the high-frequency power supply 12, and for the matching box may be listed.

As examples of the physical data sets, temperature data detected by a temperature sensor 70, pressure data detected by a pressure sensor 71, and a gas flow rate controlled by the MFC 16 may be listed. Further, as other examples of the physical data sets, data of height of the stage 20 that is adjusted by the raising-and-lowering mechanism 13 (control data for the gap G), and the like, may be listed.

[Apparatus Parameters Adjusting Process]

Figure 3:
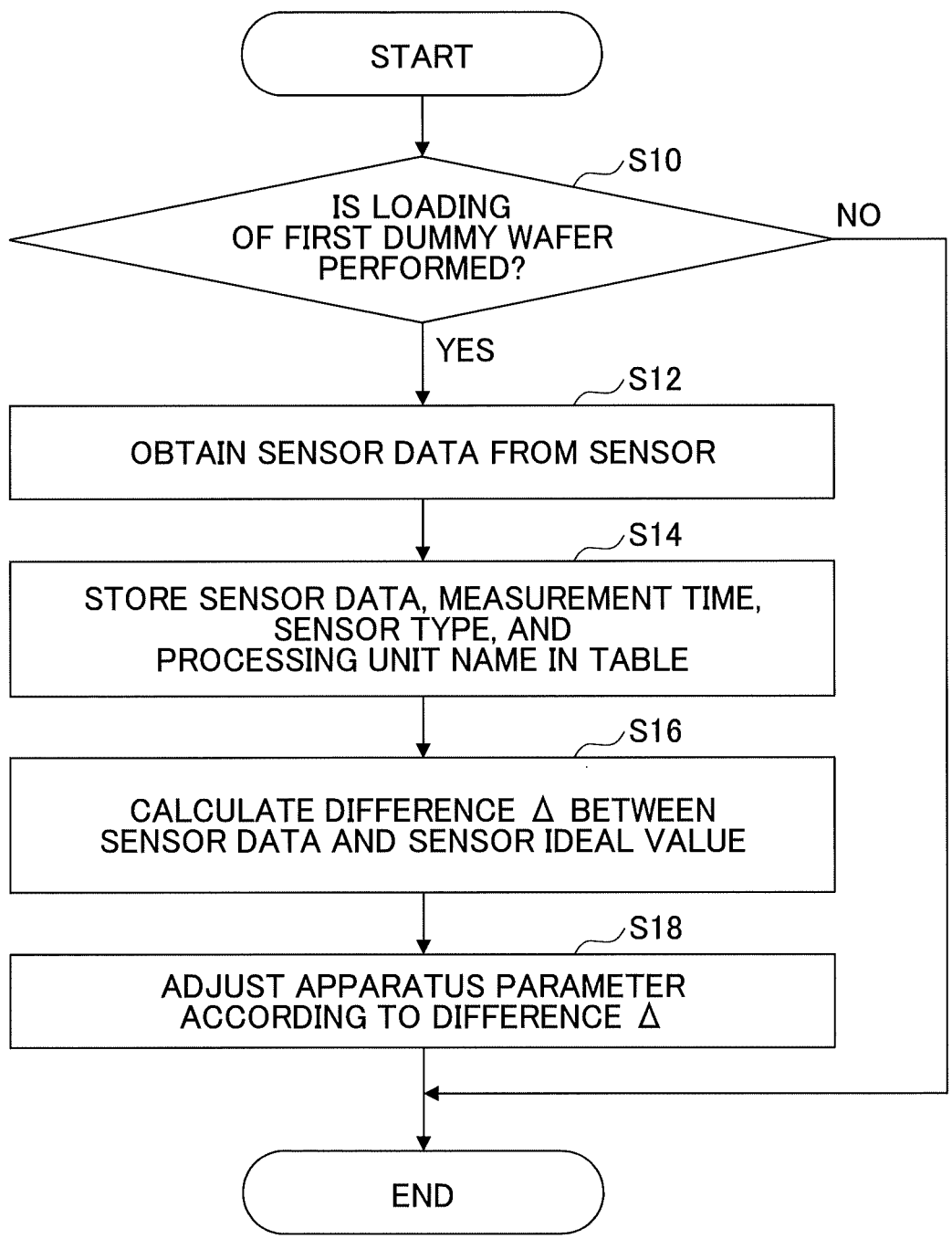
FIG. 3 is a flowchart illustrating an example of a process of adjusting apparatus parameters according to an embodiment of the present invention.

Next, referring to a flowchart in FIG. 3 in which an example of an apparatus parameters adjusting process is illustrated, the example of an apparatus parameters adjusting process according to an embodiment of the present invention will be described. This process is performed repeatedly at a predetermined period. Regarding the predetermined period, it is preferable that the process is performed regularly (e.g., once a week). The process is not limited to be performed regularly, but may be performed several times irregularly. This process is performed by the control units 1 to 4, or performed by the overall control unit 5. In an embodiment of the present invention, an example in which this process is performed by the overall control unit 5 will be described.

When this process is started, the overall control unit 5 determines whether loading of a first dummy wafer is performed (step S10). In the case where it is determined that the loading of a first dummy wafer is not performed, the overall control unit 5 ends this process. On the other hand, in the case where it is determined that the loading of a first dummy wafer is performed, the overall control unit 5 obtains sensor data sets from sensors of a processing unit into which the first dummy wafer is loaded (step S12). It should be noted that the first dummy wafer in an embodiment of the present invention is an example of first test substrates that are processed in the processing units under the same processing condition.

Next, the overall control unit 5 stores the obtained sensor data sets, measurement time, sensor types, and the name of the processing unit in a table in the memory (step S14). Next, the overall control unit 5 calculates differences Δ between the obtained sensor data sets and the ideal sensor values (step S16). Next, the overall control unit 5 adjusts the apparatus parameters according to the differences Δ (step S18), and ends the process.

Figure 5:
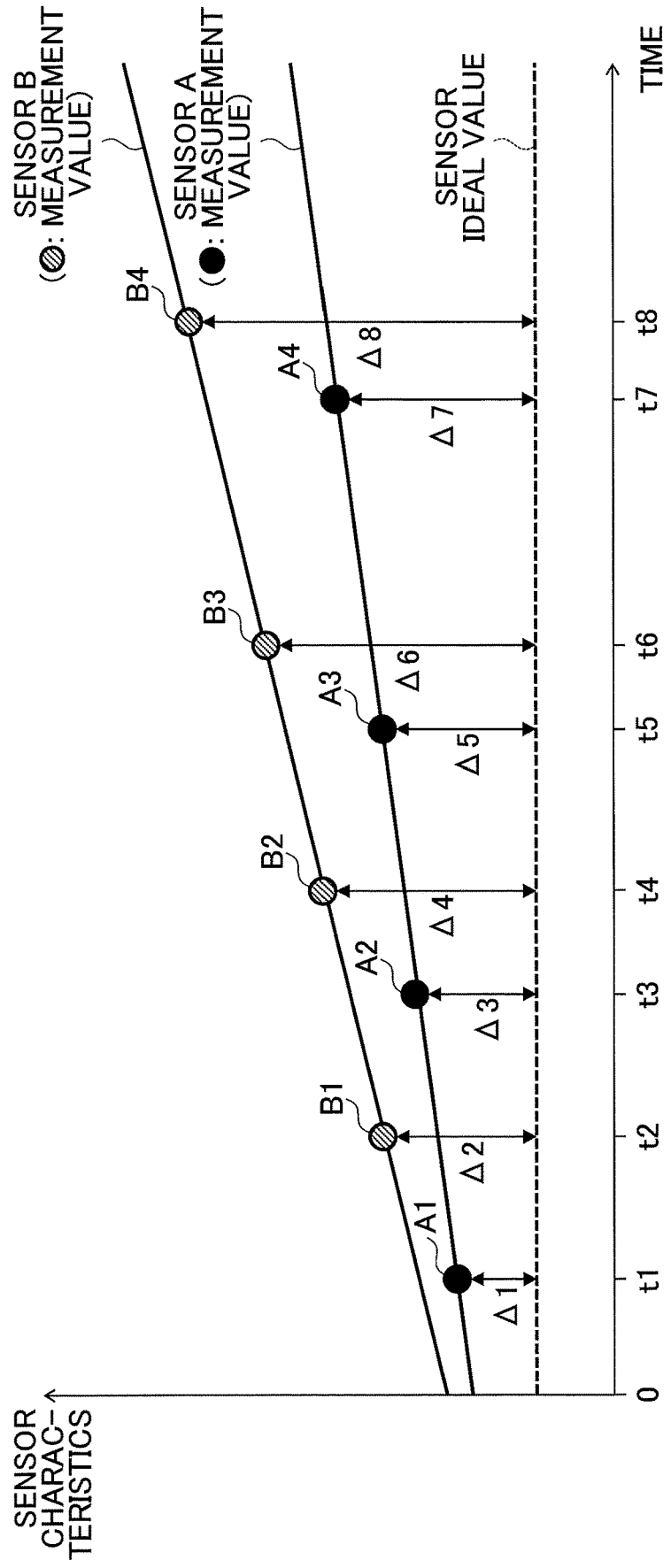
FIG. 5 is a drawing illustrating adjustment of apparatus parameters according to an embodiment of the present invention.

An example of information stored in the table in the memory (memory unit) as a result of performing the process repeatedly at a predetermined period is illustrated in FIG. 4, and an example of an estimated model of sensor data is illustrated in FIG. 5. Information including the measurement time, the sensor data sets, the sensor types, and the names of the processing units are stored in the table. Sensor types A and B are stored as, for example, the temperature sensor 70 of the processing unit CA, and the temperature sensor 70 of the processing unit CB. Temperature data sets, which are detected by the temperature sensors 70 of the processing units Ca and CB, are stored in the sensor data column of the table. In the processing unit name column, names of the processing units, in which the temperature 70 and the pressure sensor 71 are included, are stored. In the measurement time column, the time at which the measurement is performed by the sensor may be set, or the time at which the sensor data sets are obtained or stored may be set.

Estimated model information of the sensor data sets in the table illustrated in FIG. 4 is made into graphs illustrated in FIG. 5. As illustrated in FIG. 5, graphs indicating models of sensor characteristics changes over time for each sensor type (estimated models of sensor data) are generated. In examples illustrated in FIG. 4 and FIG. 5, an estimated model of sensor data for the sensor A and an estimated model of sensor data for the sensor B are generated from the changes of the sensor data sets (measurement values) over time detected by the sensor A and the sensor B in the processing unit CA and the processing unit CB, respectively.

With respect to the above, the graphs in FIG. 5 are examples, and are related to, but not limited to, the processing units CA and CB. For example, the first dummy wafers may be loaded into the other processing units CC and CD, and the estimated graphs may be generated from the sensor data sets obtained by performing the predetermined process under the same conditions and the same procedures.

In the generated estimated graphs, differences between the measurement values of the sensor A and the ideal sensor values and differences between the measurement values of the sensor B and the ideal sensor values are calculated. For example, with respect to the sensor A, the differences Δ1, Δ3, Δ5, and Δ7 between the measurement values A1, A2, A3, and A4 and the ideal sensor values are calculated, respectively. Further, with respect to the sensor B, the differences Δ2, Δ4, Δ6, and Δ8 between the measurement values B1, B2, B3, and B4 and the ideal sensor values are calculated, respectively. The calculated differences Δ1 through Δ8 indicate distances of measurement values of the sensors from the corresponding ideal values.

For example, a case is assumed in which the parts in the processing units are brand-new, the apparatus parameters of the sensors A and B are set to "100", and the output sensor data sets of the sensors A and B are "100". In this case, the measurement values of the sensor data match the ideal sensor values.

Further, it is assumed that, as a result of using the processing units for a predetermined time, the output sensor data sets of the sensors A and B are "99" when the apparatus parameters of the sensors A and B are set to "100" because of the degradation of the processing units and the degradation of the parts in the processing units. In this case, it is assumed that the output sensor data sets of the sensors A and B are "100" when the apparatus parameters are adjusted to "101". In this way, the setting values of the apparatus parameters are adjusted according to the degradation of the processing units and the degradation of the parts included in the processing units without changing the settings of the processing recipes.

Figure 6:
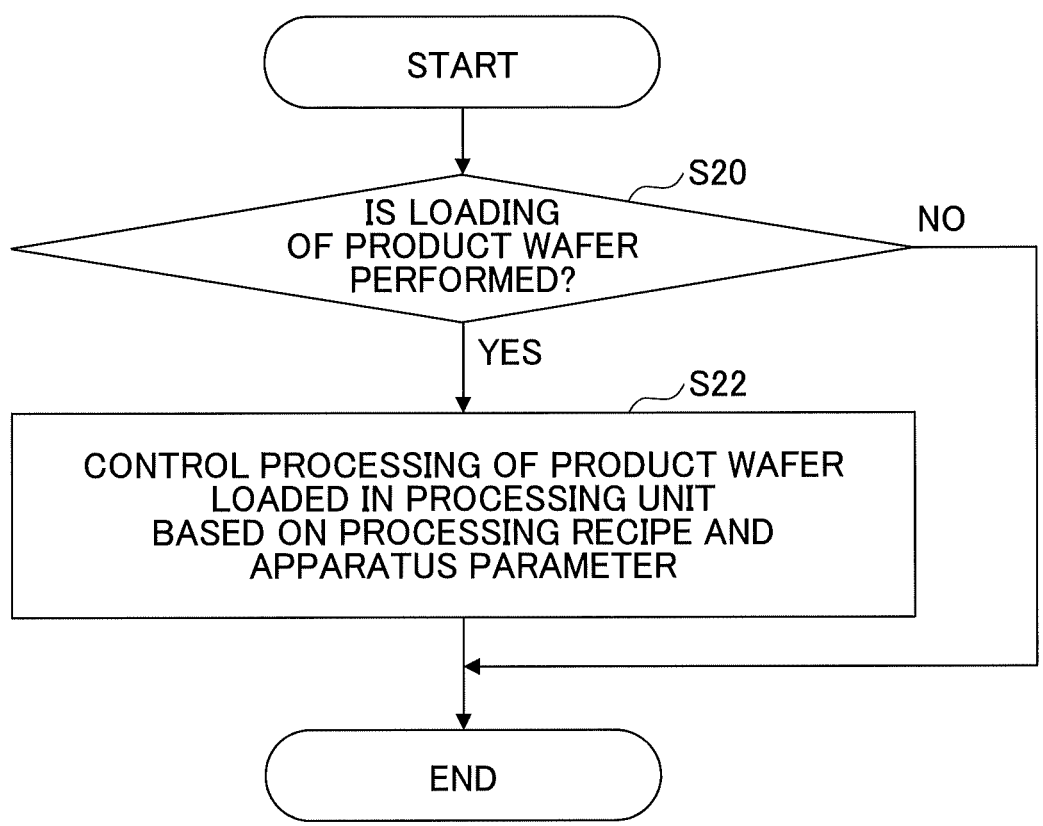
FIG. 6 is a flowchart illustrating an example of substrate processing according to an embodiment of the present invention.

Referring to FIG. 6, a substrate processing method, such as etching of a product wafer W, using the apparatus parameters adjusted as described above and the processing recipes will be described. FIG. 6 is a flowchart illustrating an example of substrate processing according to an embodiment of the present invention. In the following, an example will be described in which the process is performed by, but not limited to, the control unit 1. The substrate processing may be performed by the control units 1 to 4 in parallel. Further, the process may be performed by the overall control unit 5.

When this process is started, the control unit 1 determines whether loading of a product wafer W is performed (step S20) in the first place. When it is determined that the loading of the product wafer W is not performed, the control unit 1 ends the process. On the other hand, when it is determined that the loading of the product wafer W is performed, the control unit 1 controls a predetermined process for the product wafer W in the processing unit based on the processing recipes and the adjusted apparatus parameters (step S22), and ends the process.

There is a case in which the expected accuracy of the processing result of product wafers W cannot be obtained by merely adjusting the setting values of the processing recipes according to the individual differences of the product wafers W due to the performance differences and the degradation differences among the processing units.

With respect to the above, according to an embodiment of the present invention, input/output data sets to and from the sensors are controlled by using the adjusted apparatus parameters. For example, it is possible to control the high-frequency power output from the high-frequency power supply 12 to be within the allowable range from the ideal values of the high-frequency power by adjusting the setting values of the apparatus parameters. Similarly, with respect to other input/output data sets to and from the parts included in the processing units, it is possible to control the input/output data sets to be within the allowable range from the ideal values.

According to the above, it is possible to cause the input/output data sets to and from the sensors and the control devices to be within the allowable range from the ideal sensor values according to the adjusted apparatus parameters when the product wafer W is loaded as the "OR loading" into one of the processing units. As a result, whichever processing unit is used as a processing unit into which the product wafer W is loaded, it is possible to absorb performance variations of the processing unit, or the like, by adjusting the setting values of the apparatus parameters, and it is possible to perform processing of the product wafer W in each of the processing units with almost no variations. Further, it is possible to remove load of changing processing recipes from a user because the apparatus parameters are adjusted without changing the processing recipes.

Figure 7:
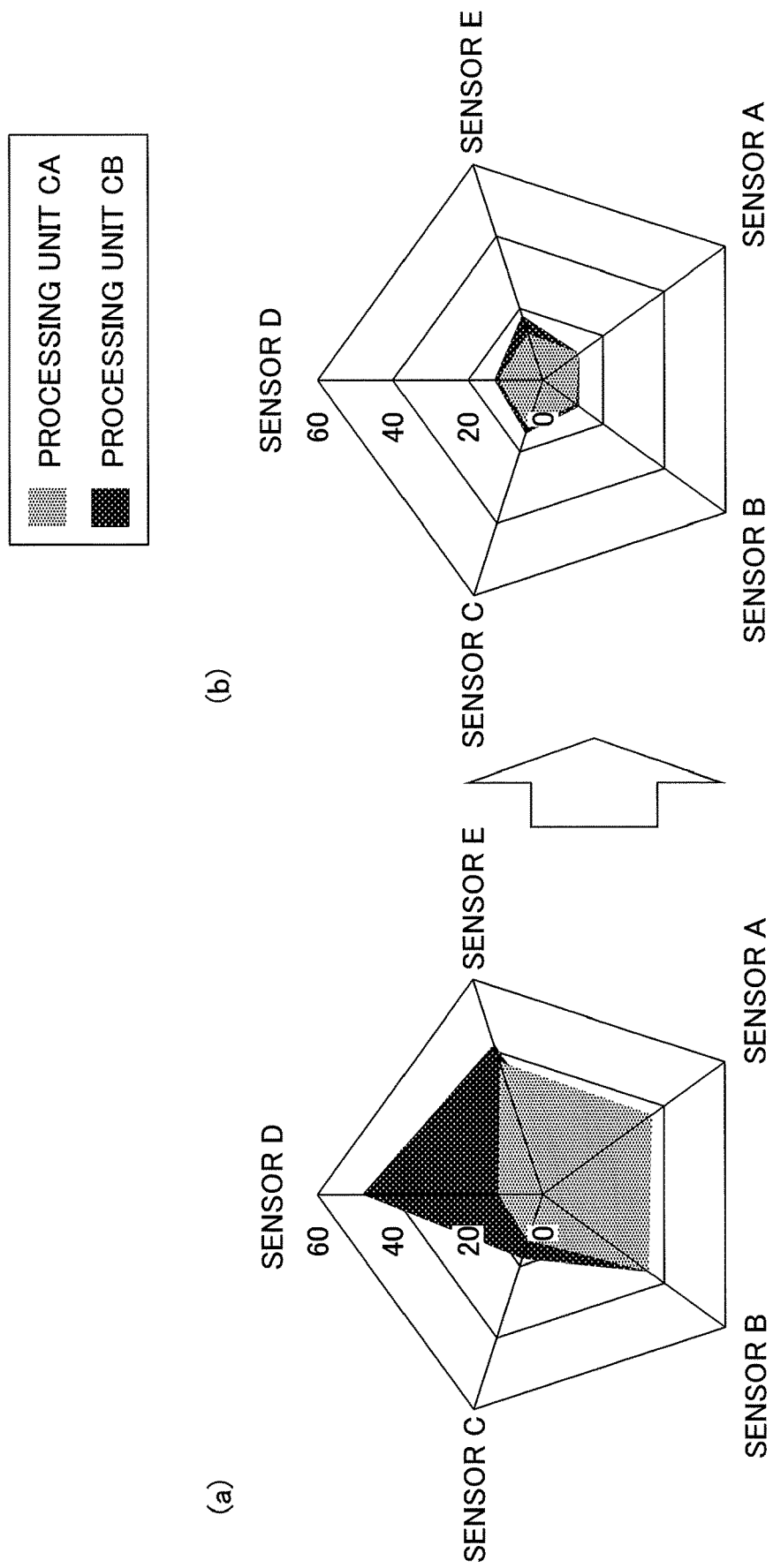
FIG. 7 is a drawing illustrating a processing unit for sensor data and performance adjustment result for each sensor according to an embodiment of the present invention.

FIG. 7 is a drawing illustrating an example of a performance adjustment result of the sensor data sets for processing units and sensors according to an embodiment of the present invention. FIG. 7(*a*) illustrates examples of ranges of the sensor data sets for the sensors A to E of the processing units CA and CB in a conventional case where predetermined processes are performed by the processing units without adjusting the apparatus parameters. FIG. 7(*b*) illustrates examples of ranges of the sensor data sets for the sensors A to E of the processing units CA and CB in a case according to an embodiment of the present invention where predetermined processes are performed by adjusting the apparatus parameters. In the above examples, the sensors A to E are included in both of the processing units A and B. However, it is not necessary for all of the sensors included in the processing unit A to be the same as the sensors included in the processing unit B.

According to the above, it is possible to absorb the variations of the sensors A to E by adjusting the apparatus parameters according to the measurement values of the sensors A to E, and it is possible to cause the characteristics of the processing units to be the same. It should be noted that the adjustment of the apparatus parameters is not limited to the above, and characteristics of all of the processing units may be caused to be the same by adjusting the apparatus parameters for all of the processing units CA, CB, CC, and CD and for all of the sensors. According to the above, in the "OR loading", whichever processing unit is used as a processing unit into which the product wafer W is loaded, it is possible to achieve uniformity of the processing of the product wafer W in the processing units CA, CB, CD, and CD by causing condition differences of the processing units CA, CB, CC, and CD to be within the allowable range by adjusting the input/output data sets according to the apparatus parameters of the processing units.

[Apparatus Parameters Adjusting Process]

Next, referring to a flowchart in FIG. 8 in which a modified example of an apparatus parameters adjusting process is illustrated, the modified example of an apparatus parameters adjusting process according to an embodiment of the present invention will be described. This process may be performed at any timing. This process is performed by the control units 1 to 4, or performed by the overall control unit 5. In an embodiment of the present invention, an example in which this process is performed by the overall control unit 5 will be described.

When this process is started, the overall control unit 5 determines whether loading of a second dummy wafer right before the loading of a product wafer W is performed (step S30). In the case where it is determined that the loading of a second dummy wafer right before the loading of a product wafer W is not performed, the overall control unit 5 ends this process. On the other hand, in the case where it is determined that the loading of a second dummy wafer right before the loading of a product wafer W is performed, the overall control unit 5 obtains sensor data sets from sensors of a processing unit into which the second dummy wafer is loaded (step S32). It should be noted that the second dummy wafer is an example of second test substrates that are processed in the processing units under the same processing condition.

Figure 9:
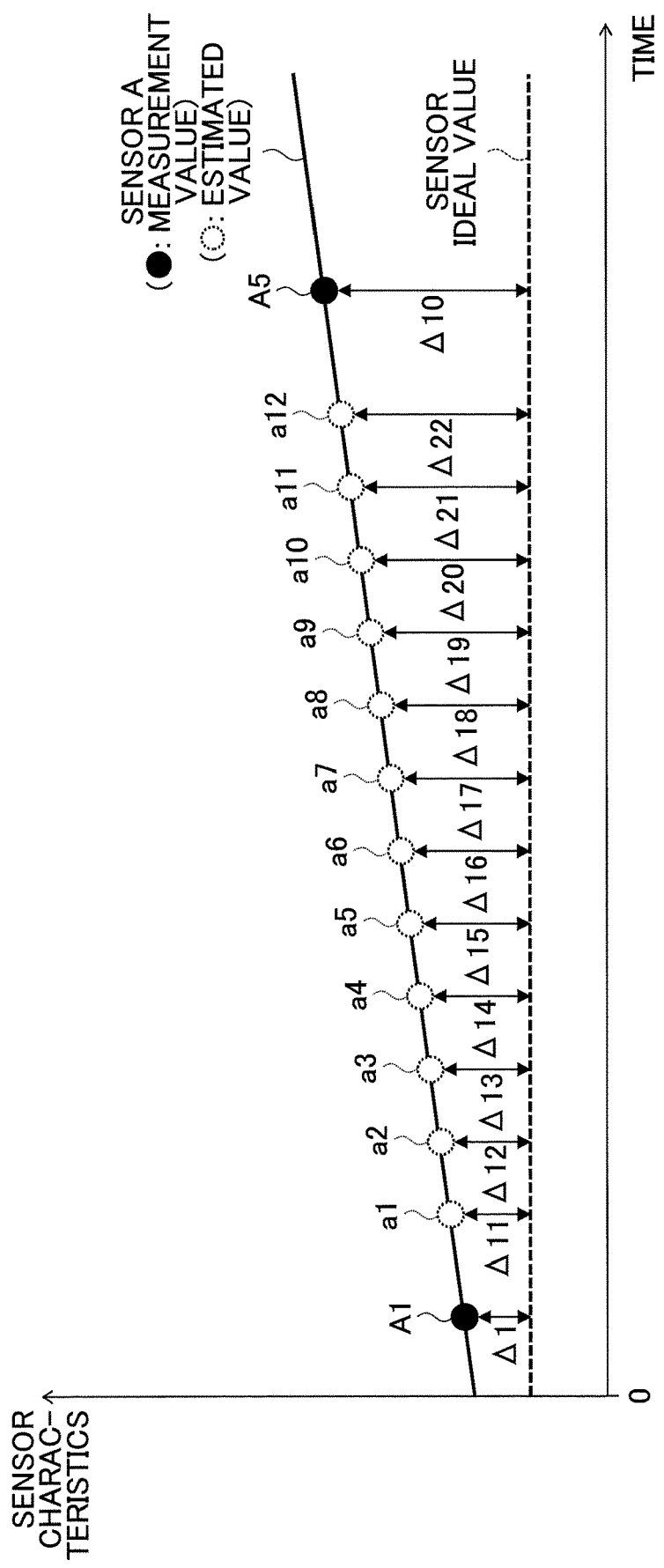
FIG. 9 is a drawing illustrating adjustment of apparatus parameters according to a modified example of an embodiment of the present invention.

Next, referring to a table of estimated models of sensor data sets, the overall control unit 5 calculates differences Δ between the obtained sensor data sets and the ideal sensor values (step S34). For example, referring to an estimated model of sensor data sets calculated from measurement values A1 and A5 illustrated in FIG. 9, in the case where the obtained sensor data is one of estimated values a1 to a12 that are not measurement values, a difference Δ between the one of the estimated values a1 to a12 and the ideal sensor value is calculated.

Next, the overall control unit 5 adjusts the apparatus parameters according to the difference Δ (step S36), and ends the process. According to the above, it is possible to calculate a difference between the sensor data measured right before processing a product wafer W using the second dummy wafer, and it is possible to adjust the apparatus parameters according to the estimated value of the difference. It should be noted that, in this case, the difference is not a measured value but an estimated value. In the modified example, the predetermined process is performed for the product wafer W using a substrate processing method illustrated in FIG. 6.

As described above, according to the modified example, the apparatus parameters of each of the processing units are adjusted based on: the sensor data sets input to or output from each of the processing units when the second dummy wafers are processed under the same processing conditions in the processing units; and estimated models of the sensor data sets of the processing units. In particular, in the modified example, it is still possible to estimate the difference between the sensor data and the ideal sensor value even in the case where the obtained sensor data is not a measured value but an estimated value between the measured values with respect to a straight line of an estimated model of measurement values (measured values) obtained from the processing of the first dummy wafers in the above-described embodiment, and it is possible to adjust the apparatus parameters in real time according to the estimated difference value.

According to the above, it is possible to cause the input/output data sets to and from the sensors to be within the allowable range from the ideal sensor values according to the adjusted apparatus parameters when the product wafer W is loaded as the "OR loading" into one of the processing units. As a result, whichever processing unit is used as a processing unit into which the product wafer W is loaded, it is possible to absorb performance variations of the processing unit and included parts by adjusting the apparatus parameters, it is possible to prevent processing result variations of the product wafer W in each of the processing units, and it is possible to achieve uniformity of the processing. Further, it is possible to remove load of changing processing recipes from a user because the apparatus parameters are adjusted without changing the processing recipes.

Figure 8:
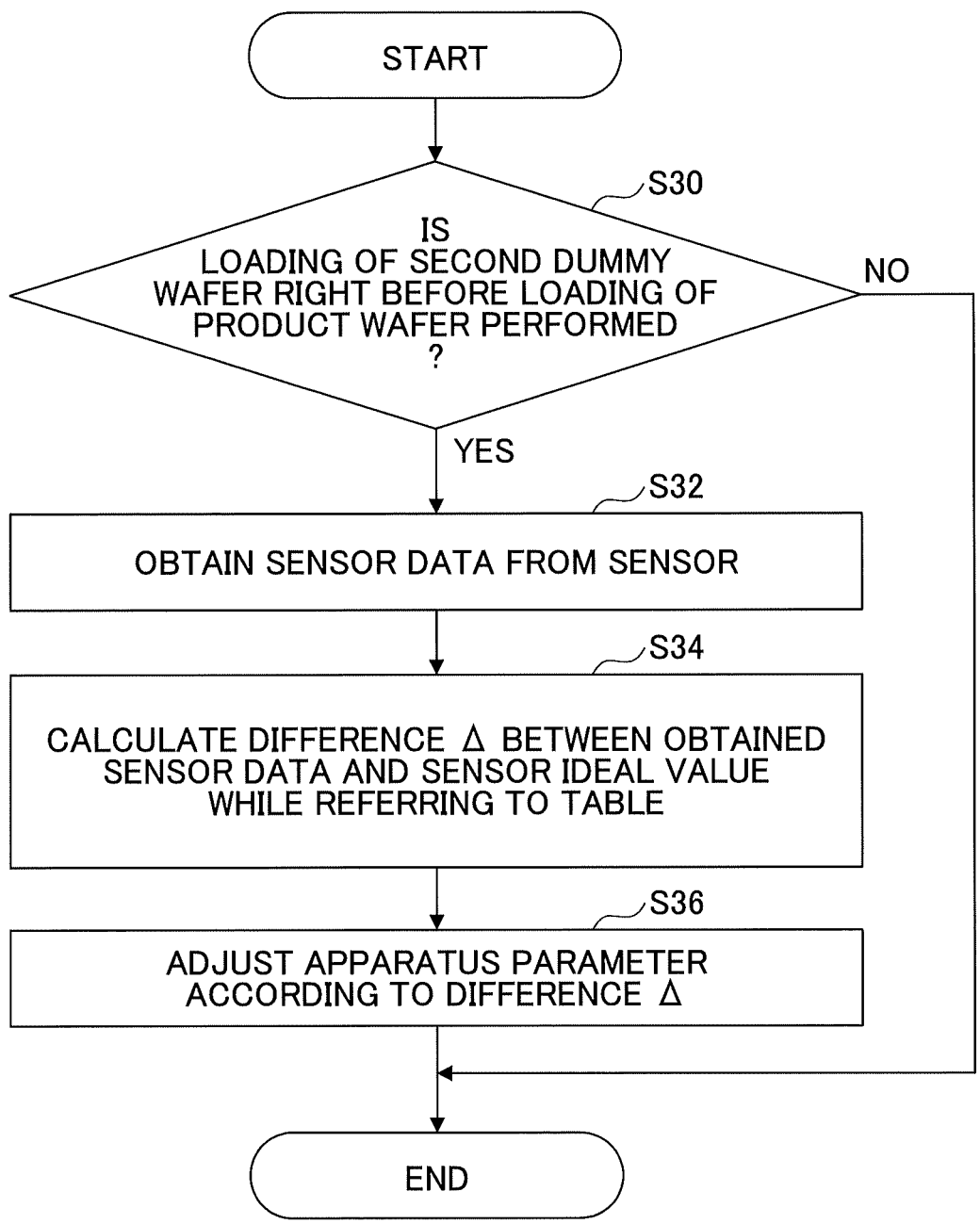
FIG. 8 is a flowchart illustrating an example of a process of adjusting apparatus parameters according to a modified example of an embodiment of the present invention.

It should be noted that, in the adjusting process of the apparatus parameters related to the modified example illustrated in FIG. 8, the second dummy wafer is processed and the apparatus parameters of the processing units are adjusted right before the product wafers W are continuously loaded into the processing units. However, the second dummy wafer for the adjusting process of the apparatus parameters related to the modified example is not limited to the dummy wafer right before the product wafers W are continuously loaded into the processing units. For example, the second dummy wafer may be a dummy wafer that is a predetermined number of wafers (e.g., several wafers) before the right before the product wafers W are continuously loaded into the processing units.

Further, the adjusting process of the apparatus parameters related to an embodiment of the present invention and the modified example may be performed at a timing of at least one of: when processing of the product wafer W is started after the start-up of the substrate processing apparatus 300; when processing of the product wafer W is started after the maintenance of the processing units; after a predetermined number of product wafers W have been processed by the processing units; and after the product wafers W have been processed for a predetermined period of time by the processing units. As described above, according to a substrate processing method related to an embodiment of the present invention and a modified example, it is possible to provide uniformity of the processing of product substrates in the processing chambers by causing differences between the conditions of the processing chambers to be within an allowable range.

As described above, substrate processing methods according to one or more embodiments of the present invention have been described. However, the substrate processing methods are not limited to the above-described embodiments, and various variations and modifications can be made within the scope of the present invention. Matters described in the embodiments may be combined within the non-conflicting range.

Further, the substrate processing apparatuses according to an embodiment of the present invention may be applied to any type including Capacitively Coupled Plasma (CCP), Inductively Coupled Plasma (ICP), Radial Line Slot Antenna, Electron Cyclotron Resonance Plasma (ECR), and Helicon Wave Plasma (HWP).

In the present specification, a product wafer is described as an example of a product substrate. However, the product substrate is not limited to a product wafer, and may be various types of substrate used for LCD (Liquid Crystal Display) and FPD (Flat Panel Display), CD substrates, printed boards, etc.

The present application is based on and claims priority to Japanese patent application No. 2017-247972 filed on Dec. 25, 2017, the entire contents of which are hereby incorporated herein by reference.

DESCRIPTION OF THE REFERENCE NUMERALS 1-4 control unit
5 overall control unit
10 processing chamber
11 matching box
12 high-frequency power supply
13 raising-and-lowering (elevator) mechanism
14 DC power supply
15 gas supplying source
16 MFC
20 stage
21 electro-static chuck
22 attracting electrode
23 focus ring
24 coolant flow path
25 gas shower head
61 exhaust apparatus
64 quartz window
72 luminescence sensor
300 substrate processing apparatus
CA, CB, CC, CD processing unit

What is claimed is:

1. A substrate processing method using a substrate processing apparatus including a plurality of processing chambers for processing a substrate, the substrate processing method comprising:
by referring to a memory unit in which an estimated model of sensor data generated from sensor data input to or output from each of the processing chambers when processing first test substrates are processed in the processing chambers under a same processing condition, the estimated model being a model indicating sensor characteristic changes over time for each sensor included in each of the processing chamber,
calculating a difference between a value of the sensor data obtained from the estimated model and an ideal sensor value;
adjusting an apparatus parameter of each of the processing chambers based on the difference;
loading product substrates continuously into the processing chambers without specifying a loading destination processing chamber; and
when the product substrate is loaded into a processing chamber of the processing chambers in the loading,
adjusting the sensor data input to or output from the processing chamber into which the product substrate has been loaded based on the apparatus parameter of the processing chamber that has been adjusted in the adjusting; and
processing the product substrate.

2. The substrate processing method according to claim 1, wherein the adjusting includes adjusting the apparatus parameter of each of the processing chambers according to the sensor data input to or output from each of the processing chambers when second test substrates are processed under the same processing condition in the processing chambers, and
an estimated model of the sensor data of each of the processing chambers.

3. The substrate processing method according to claim 1, wherein the sensor data is at least one of optical data, electric data, and physical data input to or output from each of the processing chamber.

4. The substrate processing method according to claim 1, wherein the apparatus parameter includes a parameter for at least one of a high-frequency power control device, a pressure control device, a gas control device, a temperature control device, a DC voltage control device, and a position control device.

5. The substrate processing method according to claim 1, wherein the adjusting is performed at a timing of at least one of
- when processing of the product substrate is started after a start-up of the substrate processing apparatus,
- when processing of the product substrate is started after a maintenance of the processing chambers,
- after a predetermined number of product substrates have been processed by the processing chambers, and
- after the product substrates have been processed for a predetermined period of time by each of the processing chambers.

6. The substrate processing method according to claim 2, wherein the adjusting includes processing second test substrates in the processing chambers under the same processing condition right before the product substrate is loaded into one of the processing chambers, and adjusting the apparatus parameter of each of the processing chambers.

* * * * *